US005617358A

United States Patent [19]
Kodama

[11] Patent Number: 5,617,358
[45] Date of Patent: Apr. 1, 1997

[54] NONVOLATILE SEMICONDUCTOR MEMORY DEVICE CAPABLE OF CONVERGING THRESHOLD VOLTAGE WITH LOW POWER SUPPLY VOLTAGE

[75] Inventor: Noriaki Kodama, Tokyo, Japan

[73] Assignee: NEC Corporation, Japan

[21] Appl. No.: 402,037

[22] Filed: Mar. 10, 1995

[30] Foreign Application Priority Data

Mar. 11, 1994 [JP] Japan .................................... 6-066427

[51] Int. Cl.⁶ ............................................. G11C 11/34
[52] U.S. Cl. ........................... 365/185.29; 365/185.3; 365/185.24; 365/185.14; 365/218; 365/189.01
[58] Field of Search .................................... 365/188, 218, 365/189.01, 185.29, 185.24, 185.3, 185.04

[56] References Cited

U.S. PATENT DOCUMENTS 4,794,565  12/1988  Wu et al. .................................. 365/185

OTHER PUBLICATIONS

Yamada, S., et al., "A Self–Convergence Erasing Scheme For A Simple Stacked Gate Flash Eeprom", IEDM Tech. Dig., pp. 307–310, 1991.

Liu, David, K.Y., et al., "Optimization of A Source–Side–Injection Famos Cell for Flash Eprom Applications", IEDM Tech. Dig., pp. 315–318, 1991.

Primary Examiner—David C. Nelms
Assistant Examiner—F. Niranjan

[57] ABSTRACT

In a nonvolatile semiconductor device having a floating gate formed over a semiconductor substrate, a control gate formed over the floating gate, a source region and a drain region formed within the semiconductor substrate, an erase or write operation is carried out by Fowler-Nordheim tunneling, so that carriers such as electrons and holes are expelled from the floating gate to one of the source and drain regions. Thereafter, carriers of a channel current flowing between the source and drain regions are enhanced and injected into the floating gate, thus converging a threshold voltage of the device.

8 Claims, 14 Drawing Sheets

ERASE MODE

Vth CONVERGENCE MODE

ERASE MODE

Vth CONVERGENCE MODE

Fig. 9A  ERASE MODE
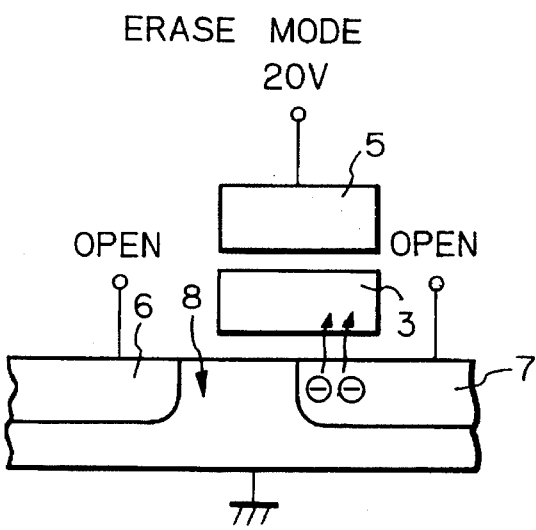
Fig. 9B  WRITE MODE
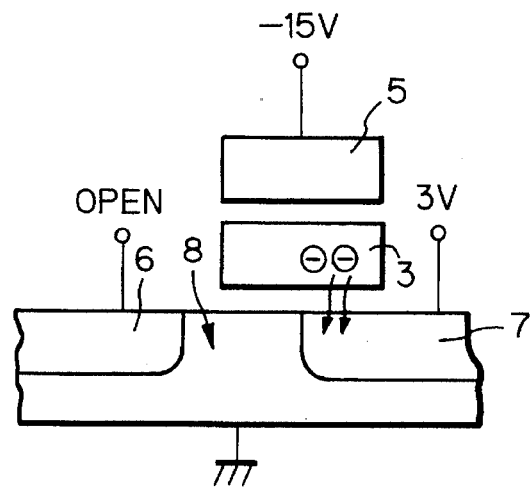
Fig. 9C  Vth CONVERGENCE MODE
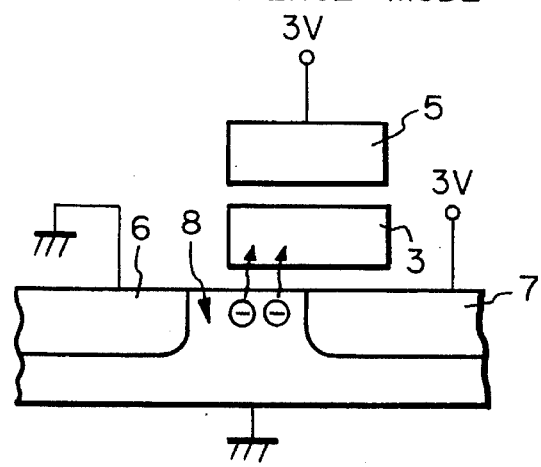

ERASE MODE

Vth CONVERGENCE MODE

Fig. 12A    ERASE MODE
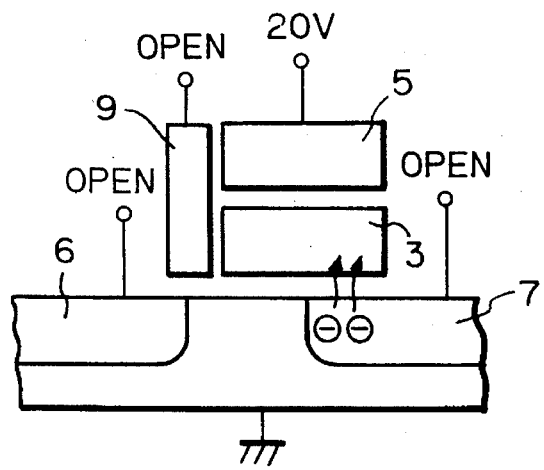
Fig. 12B    WRITE MODE
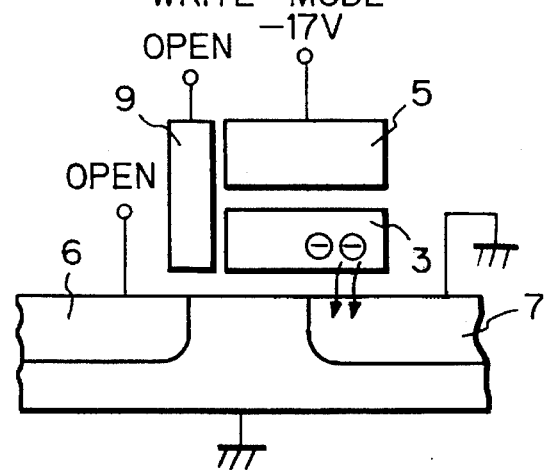
Fig. 12C   Vth CONVERGENCE MODE
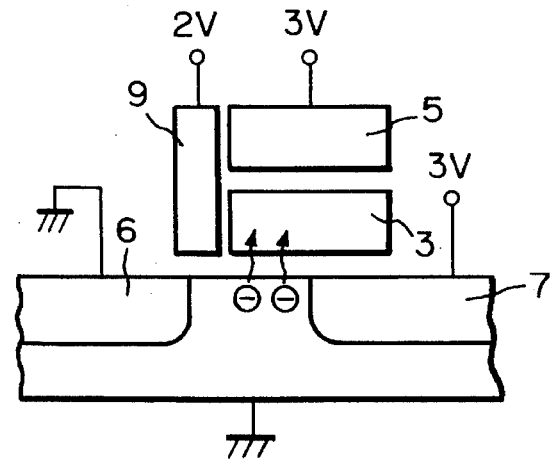

ERASE OR WRITE MODE

Vth CONVERGENCE MODE

ERASE OR WRITE MODE

Vth CONVERGENCE MODE

NONVOLATILE SEMICONDUCTOR MEMORY DEVICE CAPABLE OF CONVERGING THRESHOLD VOLTAGE WITH LOW POWER SUPPLY VOLTAGE

BACKGROUND OF THE INVENTION

1. Field of the Invention

The present invention relates to a nonvolatile semiconductor memory device such as an electrical erasable and programmable read only memory (EEPROM), and more particularly, to a nonvolatile semiconductor memory device capable of converging a threshold voltage after an erase or write operation is carried out.

2. Description of the Related Art

For example, an EEPROM cell includes a P-type semiconductor substrate having an $N^+$-type source region and an $N^+$-type drain region, a floating gate over the semiconductor substrate between the source region and the drain region, and a control gate over the floating gate. In an erase mode, a positive voltage is applied to the drain region, and the control gate is grounded. As a result, electrons stored in the floating gate are expelled therefrom to the drain region utilizing Fowler-Nordheim tunneling. To realize the Fowler-Nordheim tunneling, an insulating layer between the floating gate and the semiconductor substrate is made very thin, for example, about 6 to 20 nm.

In the above-described erase mode, however, when more or fewer electrons than those injected in a write mode are expelled from the floating gate in accordance with the thickness of the insulating layer and the like, and as a result, the threshold voltage of the EEPROM cell is greatly fluctuated. At worst, the threshold voltage of the EEPROM cell is made negative by an over-erase operation, i.e., the EEPROM cell becomes a depletion-type transistor. In this case, when writing data into this EEPROM cell, a large current flows between the source region and the drain region to reduce the potential at the drain, so that it is impossible to carry out a write operation. Also, currents flow through non-selected EEPROM cells.

In order to converge the threshold voltage of the EEPROM cell after the erase operation thereupon is completed, a threshold voltage converging method is carried out (see: S. Yamada et al., "A SELF-CONVERGENCE ERASING SCHEME FOR A SIMPLE STACKED GATE FLASH EEPROM", IEDM Tech. Dig., pp. 307–310, 1991). This will be explained later in detail.

In the above-described prior art threshold voltage converging method, however, since use is made of an avalanche breakdown occurring in the vicinity of the drain region, a high voltage such as 5 V has to be applied to the drain region. As a result, a large capacity of pump (step-up) circuit for generating such a high voltage is required, thus reducing the integration.

SUMMARY OF THE INVENTION

It is an object of the present invention to provide a nonvolatile semiconductor semiconductor capable of converging a threshold voltage with a low power supply voltage.

According to the present invention, in a nonvolatile semiconductor device having a floating gate formed over a semiconductor substrate, a control gate formed over the floating gate, a source region and a drain region formed within the semiconductor substrate, an erase or write operation is carried out by Fowler-Nordheim tunneling, so that carriers such as electrons and holes are expelled from the floating gate to one of the source or drain regions. Thereafter, carriers of a channel current flowing between the source and drain regions are enhanced and injected into the floating gate, thus converging a threshold voltage of the device.

Thus, since the carriers of the channel current are injected into the floating gate, i.e., since use is not made of an avalanche breakdown, an extremely high voltage applied to the drain region is unnecessary.

BRIEF DESCRIPTION OF THE DRAWINGS

The present invention will be more clearly understood from the description as set forth below, as compared with the prior art, with reference to the accompanying drawings, wherein:

FIGS. 9A, 9B and 9C are other cross-sectional views showing the operation of the device of FIG. 4;

FIGS. 12A, 12B and 12C are other cross-sectional views showing the operation of the device of FIG. 10.

DESCRIPRION OF THE PREFERRED EMBODIEMNTS

Before the description of the preferred embodiments, a prior art nonvolatile semiconductor memory device will be explained with reference to FIGS. 1, 2A, 2B and 3 (see: S. Yamada et al., "A SELF-CONVERGENCE ERASING SCHEME FOR A SIMPLE STACKED GATE FLASH EEPROM", IEDM Tech. Dig., pp. 307–310, 1991).

Figure 1:
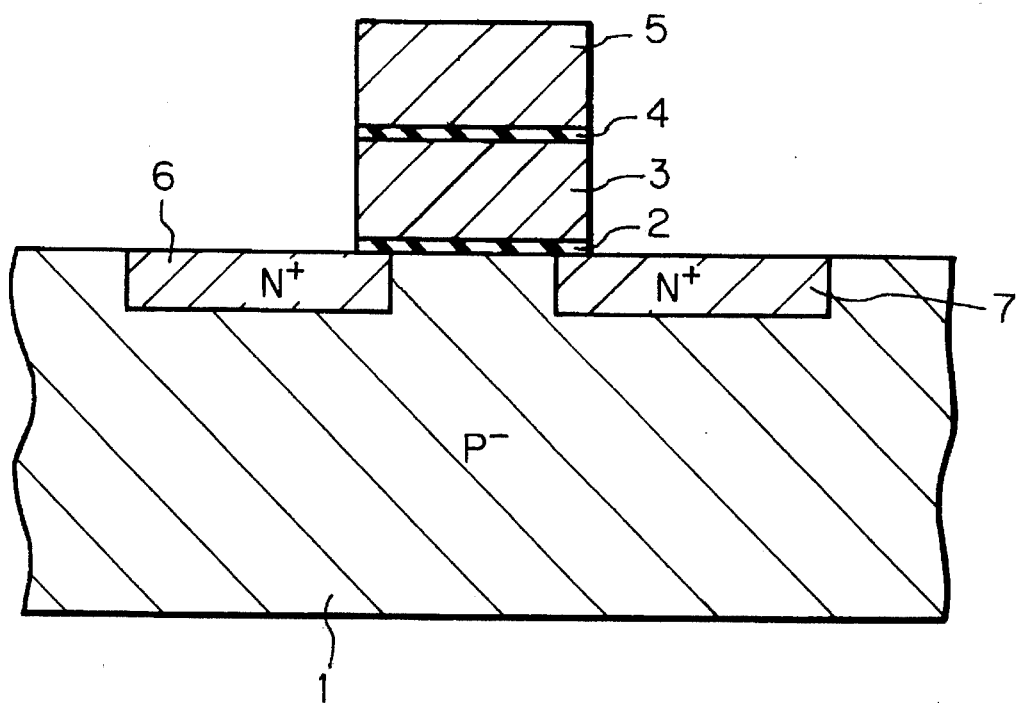
FIG. 1 is a cross-sectional view illustrating a prior art nonvolatile semiconductor memory device.

In FIG. 1, reference numeral 1 designates a P-type silicon monocrystalline substrate on which an about 10 nm thick silicon oxide layer 2 is formed. Formed on the silicon oxide layer 2 is a floating gate 3 made of polycrystalline silicon. Also, formed on the floating gate 3 is an about 20 nm thick gate insulating layer 4 made of silicon oxide and silicon nitride. Further, formed on the gate insulating layer 4 is a control gate 5 made of polycrystalline silicon.

Further, N-type impurities are introduced into the substrate 1 in self-alignment with the floating gate 3 and the control gate 5, to create $N^+$-type impurity regions, i.e., a source region 6 and a drain region 7, thus forming a cell transistor.

In FIG. 1, in a read mode where electrons are not accumulated in the floating gate 3, when a positive voltage such as 5 V is applied to the control gate 5, the cell transistor enters an ON state. On the other hand, in a read mode where electrons are accumulated in the floating gate 3, even when the positive voltage 5 V is applied to the control gate 5, the cell transistor remains in an OFF state, since the presence of electrons in the floating gate 3 makes the threshold voltage of the cell transistor higher than 3 V. For example, in this case, this threshold voltage is 8 V. Note that the ON and OFF states of the cell transistor correspond to data "0" and "1", respectively.

Figure 2A:
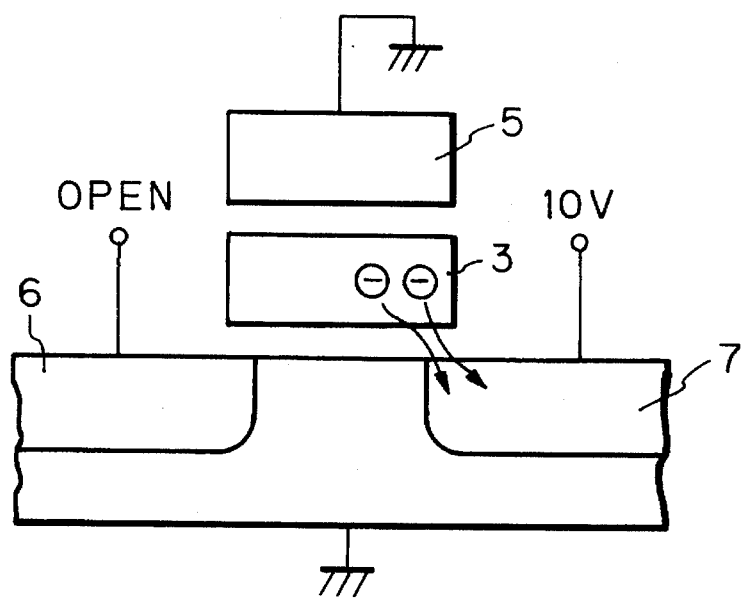
FIGS. 2A and 2B are cross-sectional views showing the operation of the device of FIG. 1.

In an erase mode, as shown in FIG. 2A, the source region 6 is in a floating state, the control gate 5 is grounded, and the drain region 7 is caused to be at an extremely high voltage such as 10 V. As a result, the electrons accumulated in the floating gate 3 are expelled therefrom to the drain region 7 by Fowler-Nordheim tunneling.

After the above-described erase mode is completed, the threshold voltage is preferably at a certain value such as 2 V, so as to sufficiently turn ON the cell transistor by applying the positive voltage 5 V to the control gate 5. However, actually, more or fewer electrons than those accumulated n the floating gate are expelled therefrom in accordance with the thickness of the silicon oxide layer 2, the thickness of the gate insulating layer 4, and the like. As a result, the threshold voltage of the cell transistor is greatly fluctuated. For example, the threshold voltage is changed from 0.8 V to 3.5 V. At worst, an over-erase operation is carried out, so that the threshold voltage of the cell transistor is made negative, i.e., the cell transistor becomes a depletion-type transistor.

When writing data in the above-described depletion-type cell transistor, a write voltage such as 3 V is applied to the drain region 7, so that a large current flows between the source region and the drain region. This reduces the potential at the drain region to disable a write operation. Also, currents flow through non-selected cell transistors.

Figure 2B:
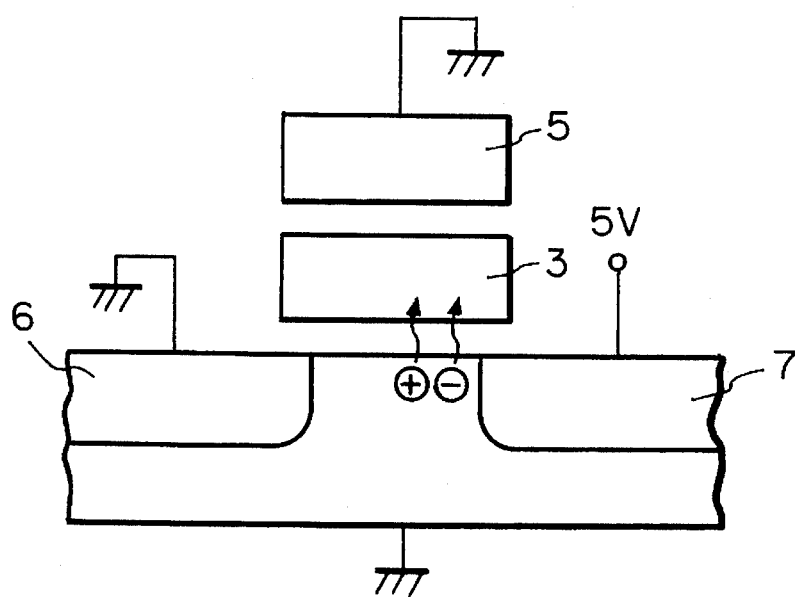

In order to converge the threshold voltage of the EEPROM cell transistor after the erase operation thereupon is completed, a threshold voltage converging method is carried out so that the threshold voltage of the cell transistor is brought close to, e.g., 2 V(see: S. Yamada et al., "A SELF-CONVERGENCE ERASING SCHEME FOR A SIMPLE STACKED GATE FLASH EEPROM", IEDM Tech. Dig., pp. 307–310, 1991). That is, as shown in FIG. 2B, the source region 6 and the control gate 5 are grounded, and the drain region 7 is caused to be at 5 V. As a result, the potential at the floating gate 3 is reduced by about 1 to 3 V due to the capacitive coupling of the drain region 7 to the floating gate 3. Therefore, a channel current flows so that high energy channel electrons are injected into a drain depletion region which invites avalanche breakdown therein. Thus, electron-hole pairs are generated in the vicinity of the drain region 7, and hot avalanche electrons and/or hot avalanche holes of the electron-hole pairs are injected along a perpendicular electric field into the floating gate 3, to adjust the threshold voltage of the cell transistor. In this case, if the threshold voltage is higher than an optimum value such as 2 V, the hot avalanche holes are injected into the floating gate 3, while, if the threshold voltage is lower than the optimum value such as 2 V, the hot avalanche electrons are injected into the floating gate 3. Thus, the threshold voltage is brought close to the optimum value.

In other words, in the threshold voltage converging method, the amount of the injected holes or electrons is dependent upon the potential at the floating gate 3. Therefore, if the number of electrons in the floating gate 3 after the erase operation is too large, the reduction in potential at the floating gate 3 by the above-mentioned capacitive coupling is about 1 V, so that more hot avalanche holes than hot avalanche electrons are injected into the floating gate 3. Contrary to this, if the number of electrons in the floating gate 3 after the erase operation is too small, the reduction in potential at the floating gate 3 by the above-mentioned capacitive coupling is about 3 V, so that more hot electrons holes than hot avalanche holes are injected into the floating gate 3. Thus, the number of electrons accumulated in the floating gate 3 is brought close to a definite value, i.e., the threshold voltage is brought close to the optimum value. Actually, a fluctuation of about ±0.5 V of the threshold voltage can be obtained in the entire of an EEPROM cell array. In the threshold voltage converging method as shown in FIG. 2B, however, since use is made of hot avalanche breakdown carriers occurring in the vicinity of the drain region 7, a high voltage such as 5 V bas to be applied to the drain region.

Figure 3:
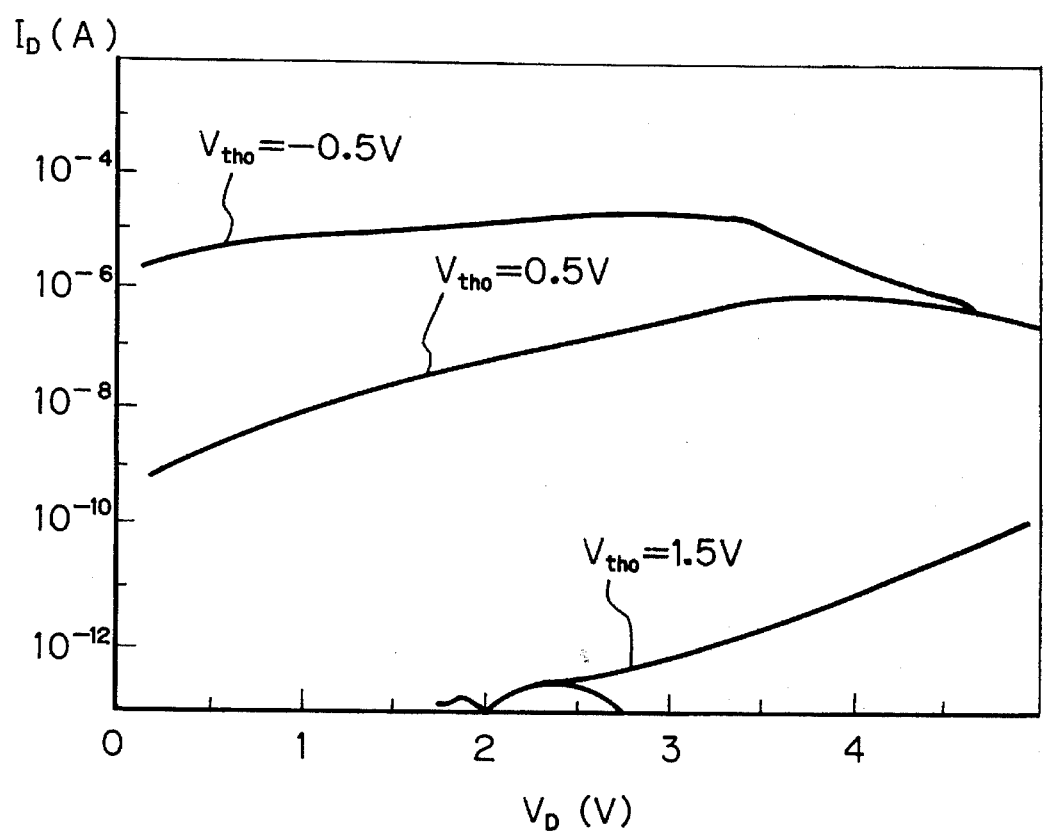
FIG. 3 is a graph showing hot electron injection characteristics of the device of FIG. 1.

For example, as shown in FIG. 3, if an initial threshold voltage $V_{th^0}$ after an erase operation is −0.5 V or 0.5 V, the voltage $V_D$ at the drain region is required to be higher than 3.5 V, preferably, 5 V, in order to inject hot avalanche electrons into the floating gate 3.

Particularly, if the device uses a single power supply voltage of 3 V, a pump (step-up) circuit for generating such a high voltage is incorporated into the device. In addition, in a 64 Kbit cell array, a large current has to be supplied from the pump circuit, and accordingly, the pump circuit has to be very large, thus reducing the integration of the device.

Figure 4:
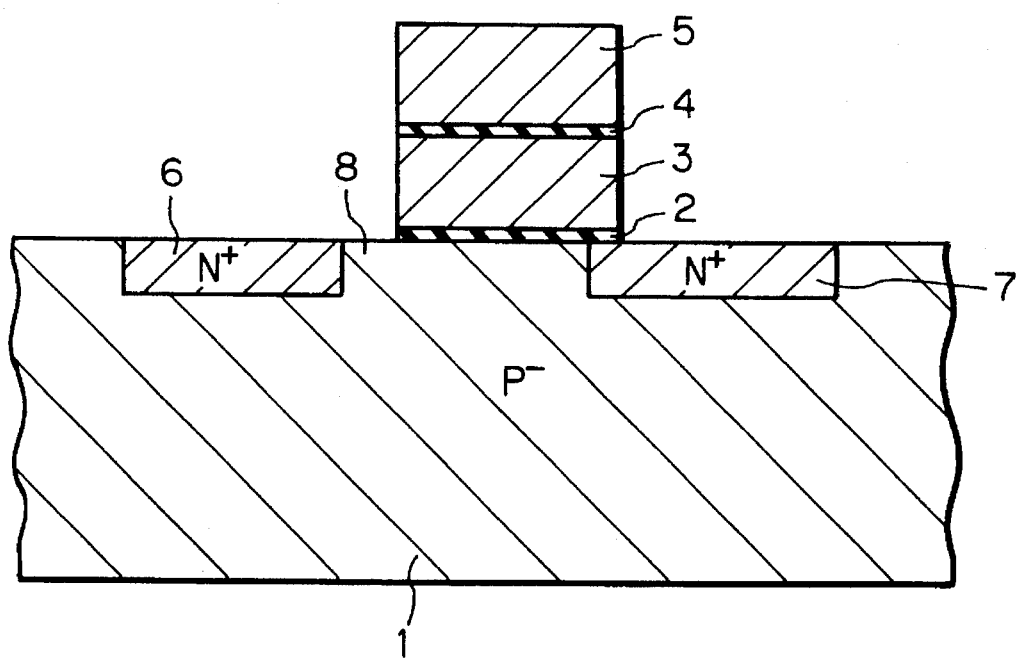
FIG. 4 is a cross-sectional view illustrating a first embodiment of the nonvolatile semiconductor device according to the present invention.

In FIG. 4, which illustrates a first embodiment of the present invention, the source region 6 is displaced by an offset portion 8 from the floating gate 3. Note that the configuration of FIG. 4 per se is disclosed in David K. Y. Liu et al., "OPTIMIZATION OF A SOURCE-SIDE FAMOS CELL FOR FLASH EPROM APPLICATIONS", IEDM Tech. Dig., pp. 315–318, 1991, which is, however, directed to effectively carrying out a write operation with a low drain voltage.

In FIG. 4, the offset portion 8 serves as a high resistance element. Therefore, when a positive voltage such as 3 V is applied to the control gate 5 and the drain region 7 while the source region 6 is grounded, a strong channel (horizontal) electric field for generating hot carriers is generated, and simultaneously, a strong vertical electric field between the floating gate 3 and the source region 6 is generated.

Figure 5A:
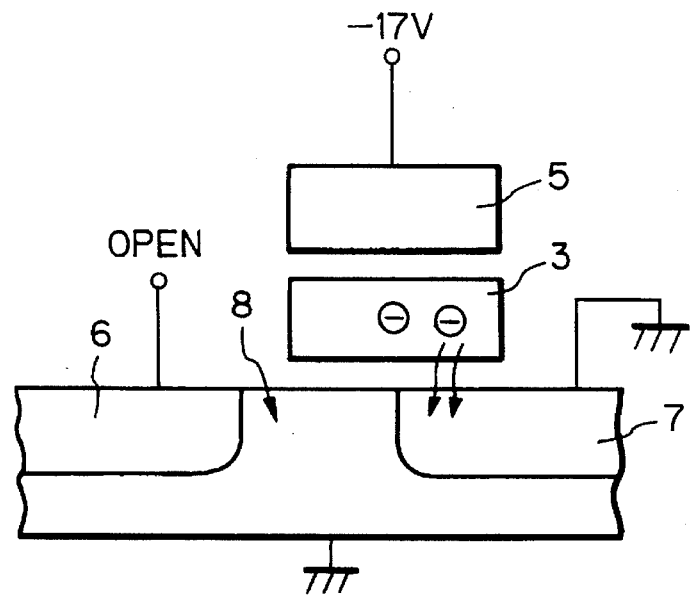
FIGS. 5A and 5B are cross-sectional views showing the operation of the device of FIG. 4.

In an erase mode, as shown in FIG. 5A, the source region 6 is in a floating state, the control gate 5 is caused to be at −17 V, and the drain region 7 is grounded. Or, the source region 6 is in a floating state, the control gate 5 is caused to be at −15 V, and the drain region 7 is caused to be at 3 V. As a result, the electrons accumulated in the floating gate 3 are expelled therefrom to the drain region 7 by Fowler-Nordheim tunneling.

Figure 5B:
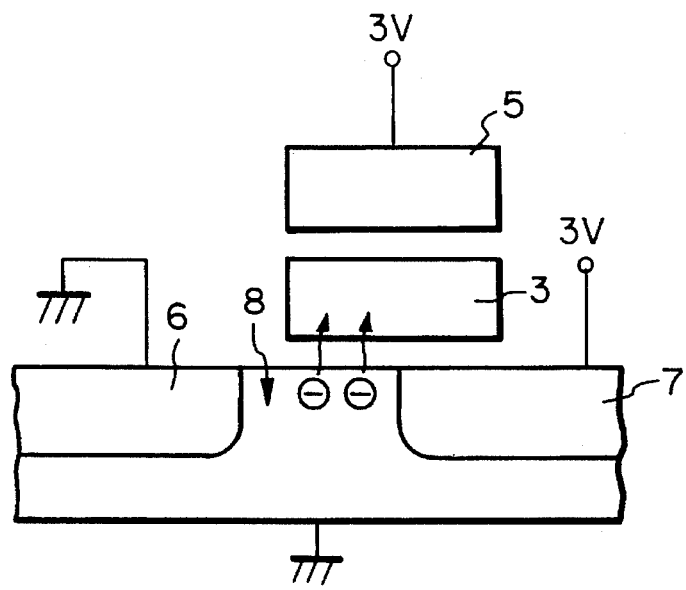

After the above-described erase operation is completed, the control proceeds to a threshold voltage converging mode as shown in FIG. 5B. That is, the source region 6 is grounded, and the control gate 5 and the drain region 7 are caused to be at 3 V. As a result, a channel current flows from the drain region 7 to the source region 6, i.e., electrons flow from the source region 6 to the drain region 7. This channel current is enhanced by the presence of the offset portion 8.

Hot channel electrons are injected from the channel region of a surface of the substrate 1 into the floating gate 3.

In this case, the number of electrons injected into the floating gate 3 is dependent upon the initial threshold voltage $V_{th}^0$ immediately after the erase operation is completed. That is, when the inital threshold voltage $V_{th}^0$ is lower, i.e., the initial potential at the floating gate 3 is higher, more hot channel electrons are injected from the channel region to the floating gate 3.

Figure 6:
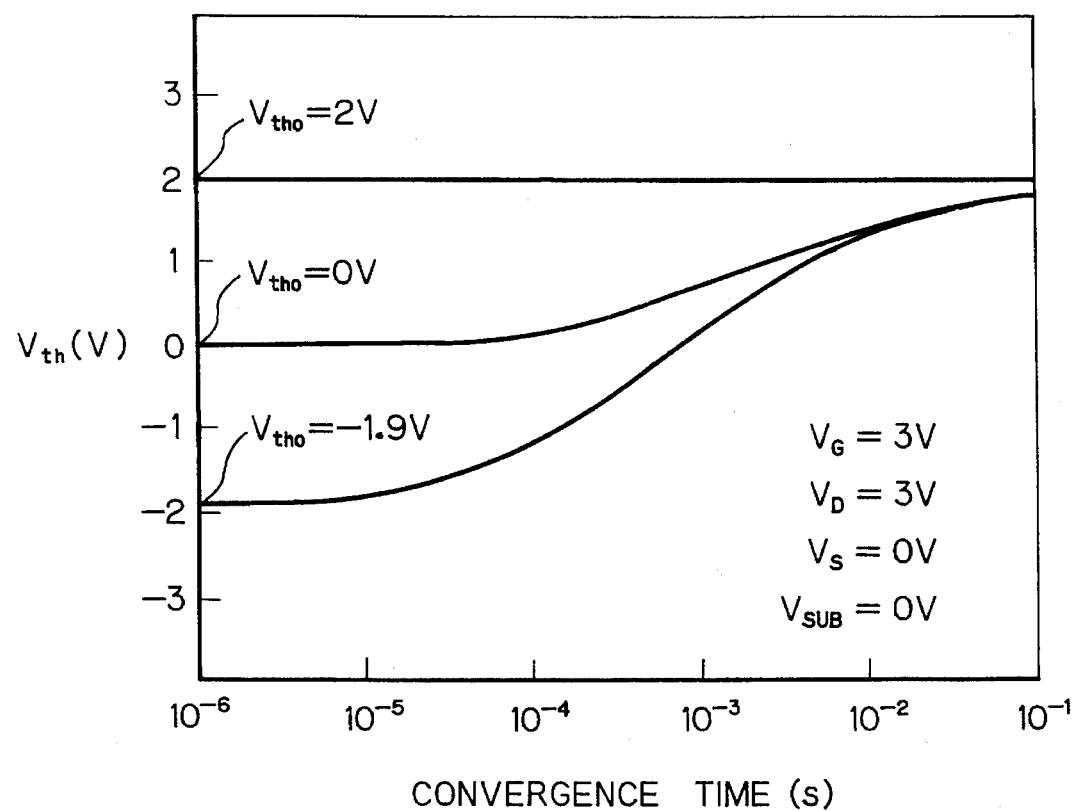
FIGS. 6 and 7 are graphs showing hot electron injection characteristics of the device of FIG. 4.

For example, as shown in FIG. 6, when the initial threshold voltage $V_{th}^0$ is about −1.9 V, the injection of hot channel electrons into the floating gate 3 continues for about 0.1s, so that the threshold voltage $V_{th}$ is brought close to about 1.9 V. In this case, the shift amount of the threshold voltage $V_{th}$ is about 3.8 V. Similarly, when the initial threshold voltage $V_{th}^0$ is about 0 V, the injection of hot channel electrons into the floating gate 3 continues for about 0.1 s, so that the threshold voltage $V_{th}$ is brought close to about 1.9 V. In this case, the shift amount of the threshold voltage $V_{th}$ is about 1.9 V. On the other hand, when the initial threshold voltage $V_{th}^0$ is higher than about 2 V, the threshold voltage $V_{th}$ remains at the initial threshold voltage $V_{th}^0$.

Thus, when the initial threshold voltage $V_{th}^0$ is lower than about 2 V, the injection of hot channel electrons into the floating gate 3 for about 0.1 s brings the threshold voltage $V_{th}$ close to about 2 V.

Note that the converged threshold voltage $V_{th}$ is adjusted by changing the potential at the control gate 5 during a convergence mode. In the threshold voltage converging method as shown in FIG. 5B, since use is made of hot channel electrons occurring in the channel region of the substrate 1 enhanced by the offset portion 8, the voltage applied to the drain region 7 can be reduced as compared with the prior art device as illustrated in FIG. 1.

Figure 7:
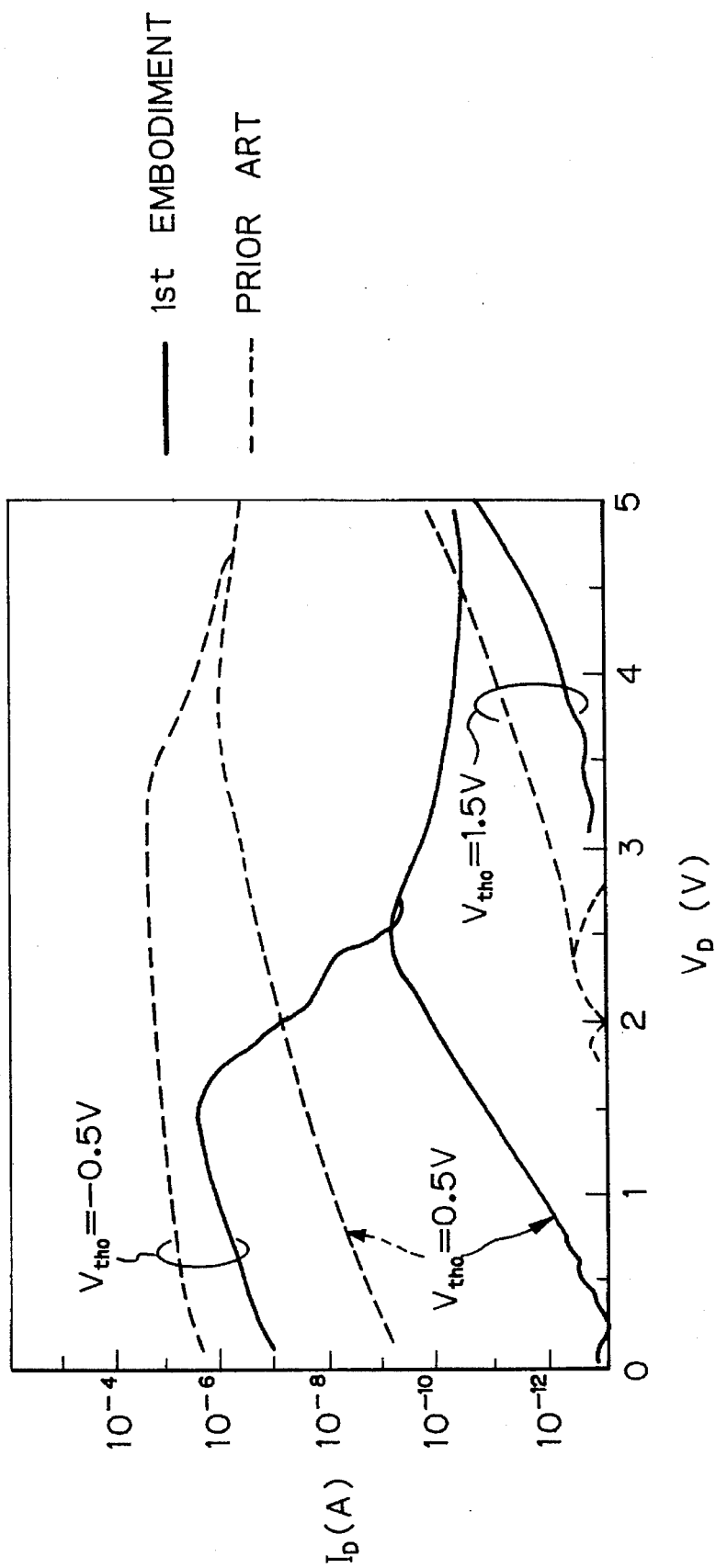

For example, as shown in FIG. 7, if the initial threshold voltage $V_{th}^0$ after an erase operation is −0.5 V or 0.5 V, the voltage $V_D$ at the drain region 7 is required to be higher than 1.5 V, preferably, 3 V, in order to inject hot channel electrons into the floating gate 3.

Thus, if the device uses a single power supply voltage such as 3 V, a pump circuit for generating a high voltage such as 5 V is unneccessary.

Figure 8:
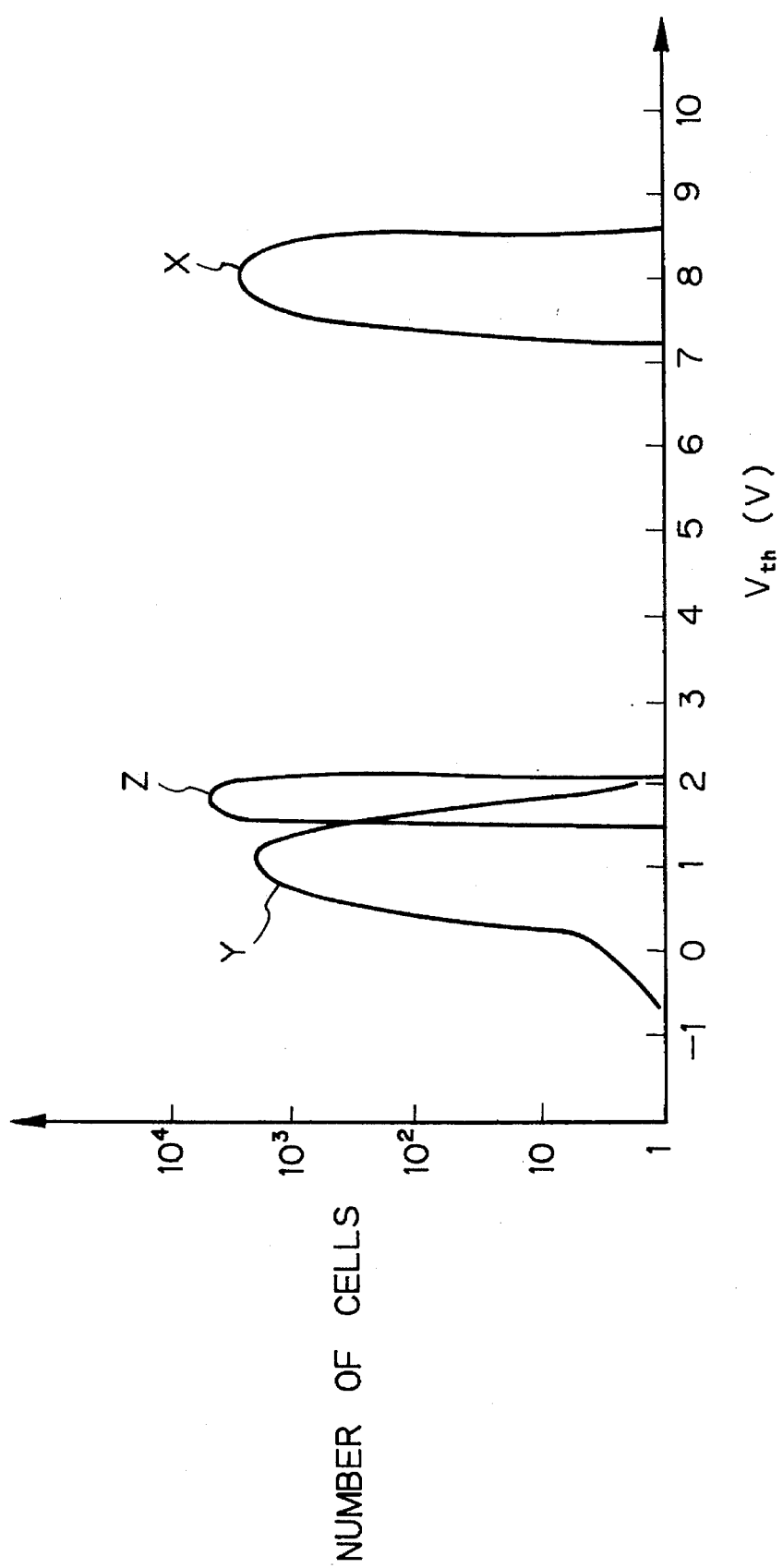
FIG. 8 is a graph showing threshold voltage characteristics of the device of FIG. 5.

When the above-described threshold voltage converging mode of the first embodiment is applied to a memory cell array having 65536 (=16×1024) cells, the distribution of threshold voltage is changed as shown in FIG. 8.

A curve X shows a distribution of threshold voltage before the erase operation as shown in FIG. 5A is carried out. In this case, electrons are accumulated in all of the cells, and therefore, the threshold voltage is centered at a mean value of about 8 V having a deviation of about 1 V.

A curve Y shows a distribution of threshold voltage after the erase operation as shown in FIG. 5A is carried out. In this case, therefore, the threshold voltage is centered at a mean value of about 1 V having a deviation of about 1.5 V. That is, the deviation of threshold voltage is increased by about 50 percent.

A curve Z shows a distribution of threshold voltage after the threshold voltage converging operation as shown in FIG. 5B is carried out for about 0.1 s. In this case, the threshold voltage is centered at a mean value of about 2.0 V having a deviation of about 0.25 V. That is, the deviation of threshold voltage is decreased by six times. Thus, the threshold voltage is converged by the threshold voltage converging operation of the first embodiment to a desired value defined by the potential applied to the control gate 5.

The first embodiment is also applied to a nonvolatile device where the threshold voltage is high after an erase operation is carried out and the threshold voltage is low after a write operation is carried out as shown in FIGS. 9A, 9B and 9C.

In an erase mode, as shown in FIG. 9A, the source region 6 is in a floating state, the control gate 5 is caused to be at about 20 V, and the drain region 7 is grounded. As a result, electrons are injected from the channel region of the substrate 1 into the floating gate 3 by Fowler-Nordheim tunneling.

In a write mode, as shown in FIG. 9B, the source region 6 is in a floating state, the control gate 5 is caused to be at about −15 V, and the drain region 7 is caused to be at about 3 V. As a result, electrons are injected from the channel region of the substrate 1 into the floating gate 3 by Fowler-Nordheim tunneling.

After the above-described write operation is completed, the control proceeds to a threshold voltage converging mode as shown in FIG. 9C. That is, the source region 6 is grounded, and the control gate 5 and the drain region 7 are caused to be at 3 V. As a result, a channel current flows from the drain region 7 to the source region 6, i.e., electrons flow from the source region 6 to the drain region 7.

Figure 10:
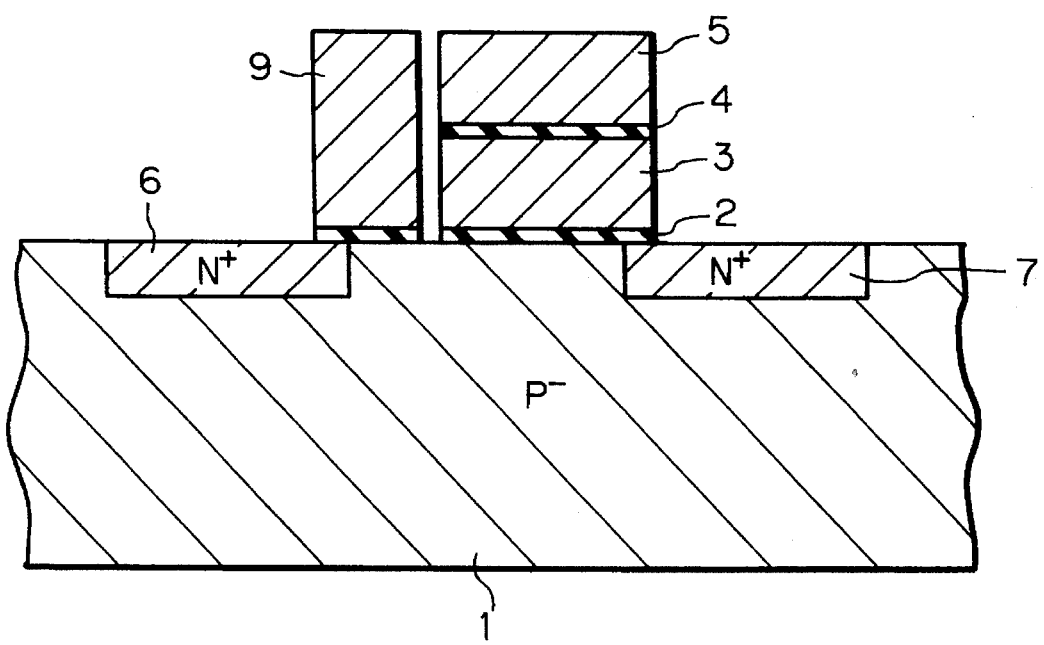
FIG. 10 is a cross-sectional view illustrating a second embodiment of the nonvolatile semiconductor device according to the present invention.

In FIG. 10, which illustrates a second embodiment of the present invention, an auxiliary gate 9 is interposed between the source region 6 and the floating gate 3 and is formed over the substrate 1 of FIG. 1. Note that the configuration of FIG. 10 per se is disclosed in U.S. Pat. No. 4,794,565 which is, however, directed to effectively carrying out a write operation with a low drain voltage.

In FIG. 10, a channel region of the substrate 1 between the auxiliary gate 9 and the floating gate 3 forms a weak gate control region. Therefore, when a positive voltage such as 2 V is applied to the auxiliary gate 9, a strong channel (horizontal) electric field for generating hot carriers is generated, thus enhancing a channel current.

Figure 11A:
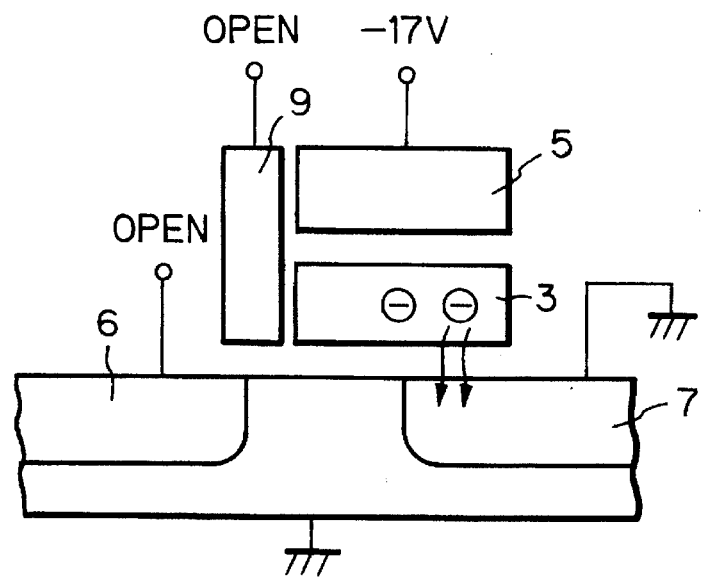
FIGS. 11A and 11B are cross-sectional views showing the operation of the device of FIG. 10.

In an erase mode, as shown in FIG. 11A, in a similar way as in FIG. 5A, the source region 6 and the auxiliary gate 9 are in a floating state, the control gate 5 is caused to be at −17 V, and the drain region 7 is grounded. Or, the source region 6 and the auxiliary gate 9 are in a floating state, the control gate 5 is caused to be at −15 V, and the drain region 7 is caused to be at 3 V. As a result, the electrons accumulated in the floating gate 3 are expelled therefrom to the drain region 7 by Fowler-Nordheim tunneling.

Figure 11B:
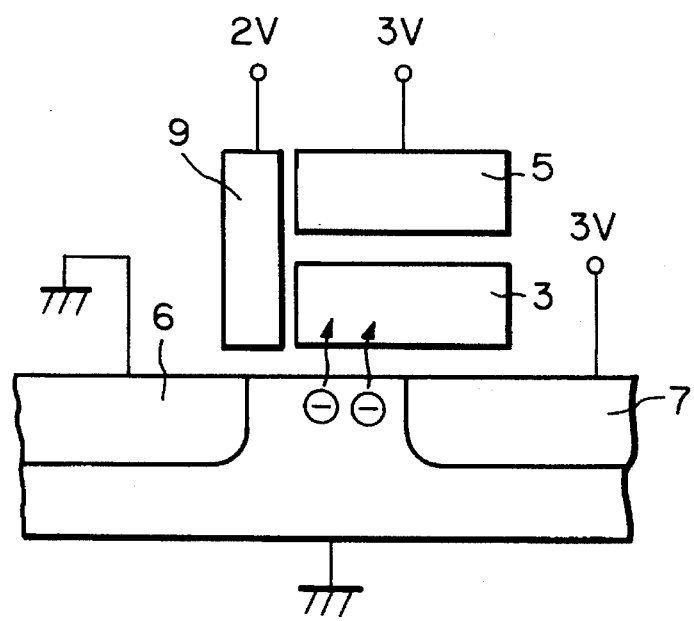

After the above-described erase operation is completed, the control proceeds to a threshold voltage converging mode as shown in FIG. 11B. That is, the source region 6 is grounded, the auxiliary gate 9 is caused to be at 2 V, and the control gate 5 and the drain region 7 are caused to be at 3 V. As a result, a channel current flows from the drain region 7 to the source region 6, i.e., electrons flow from the source region 6 to the drain region 7. This channel current is enhanced by the presence of the auxiliary gate 9.

Also, in the second embodiment, hot channel electrons are injected from the channel region of the substrate 1 into the floating gate 3. In this case, the number of electrons injected into the floating gate 3 is dependent upon the initial threshold voltage $V_{th}^0$ immediately after the erase operation is completed. That is, when the inital threshold voltage $V_{th}^0$ is lower, i.e., the initial potential at the floating gate 3 is higher, more hot channel electrons are injected from the channel region to the floating gate 3.

In the threshold voltage converging method as shown in FIG. 11B, since use is made of hot channel electrons occurring in the channel region of the substrate 1 enhanced by the auxiliary gate 9, the voltage applied to the drain region 7 can be reduced.

The second embodiment is also applied to a nonvolatile device where the threshold voltage is high after an erase operation is carried out and the threshold voltage is low after a write operation is carried out as shown in FIGS. 12A, 12B and 12C.

In an erase mode, as shown in FIG. 12A, the source region 6 and the auxiliary gate 9 are in a floating state, the control gate 5 is caused to be at about 20 V, and the drain region 7 is grounded. As a result, electrons are injected from the channel region of the substrate 1 into the floating gate 3 by Fowler-Nordheim tunneling.

In a write mode, as shown in FIG. 12B, the source region 6 and the auxiliary gate 9 are in a floating state, the control gate 5 is caused to be at about −15 V, and the drain region 7 is caused to be at about 3 V. As a result, electrons are injected from the channel region of the substrate 1 into the floating gate 3 by Fowler-Nordheim tunneling.

After the above-described write operation is completed, the control proceeds to a threshold voltage converging mode as shown in FIG. 12C. That is, the source region 6 is grounded, the auxiliary gate 9 is caused to be at 2 V, and the control gate 5 and the drain region 7 are caused to be at 3 V. As a result, a channel current flows from the drain region 7 to the source region 6, i.e., electrons flow from the source region 6 to the drain region 7.

Although the above-described first and second embodiments relate to cell transistors of an N-type, the present invention can be applied to cell transistors of a P-type. In this case, the substrate 1 is of an N-type and the regions 6 and 7 are of a P-type. Also, voltages opposite to the voltages in the first and second embodiments are applied to the control gate 5, the source region 6, the drain region 7, and the auxiliary gate 9. For example, FIGS. 5A (or 9B) and 5B (or 9C) is modified to FIGS. 13A and 13B, respectively.

Figure 13A:
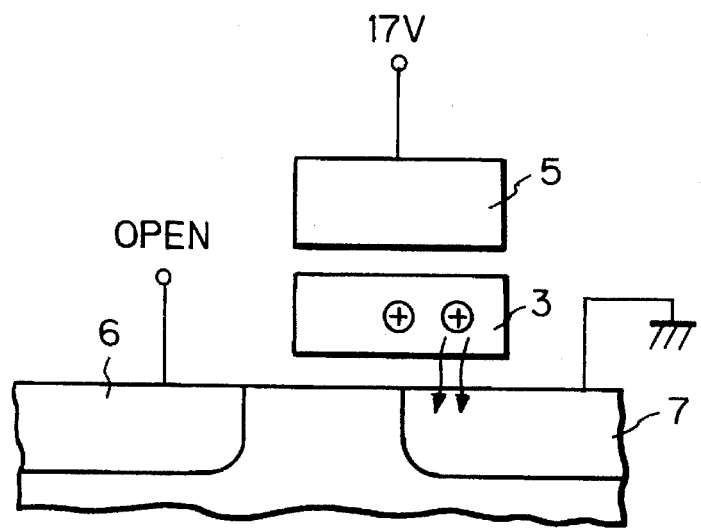
FIGS. 13A, 13B, 14A and 14B are modifications of FIGS. 5A, 5B, 11A and 11B, respectively.

As shown in FIG. 13A, the source region 6 is in a floating state, the control gate 5 is caused to be at 17 V, and the drain region 7 is grounded. Or, the source region 6 is in a floating state, the control gate 5 is caused to be at 15 V, and the drain region 7 is caused to be at 3 V. As a result, the holes accumulated in the floating gate 3 are expelled therefrom to the drain region 7 by Fowler-Nordheim tunneling.

Figure 13B:
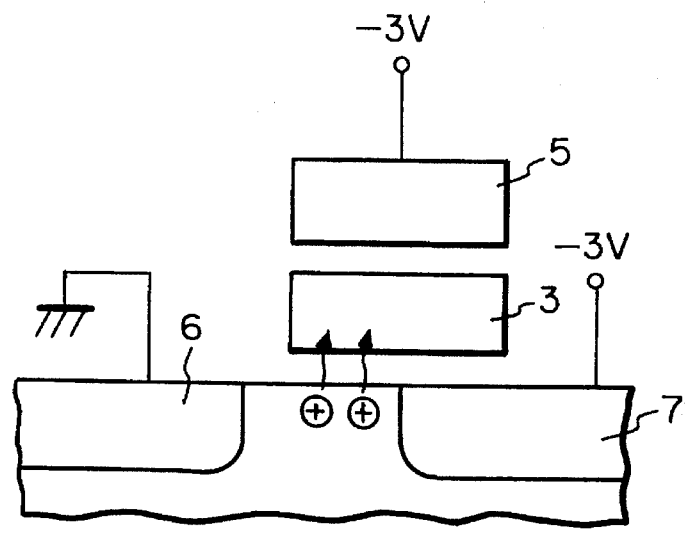

After the above-described operation as shown in FIG. 13A is completed, the control proceeds to a threshold voltage converging mode as shown in FIG. 13B. That is, the source region 6 is grounded, and the control gate 5 and the drain region 7 are caused to be at −3 V. As a result, a channel current flows from the source in region 6 to the drain region 7, i.e., holes flow from the drain region 7 to the source region 6.

Figure 14A:
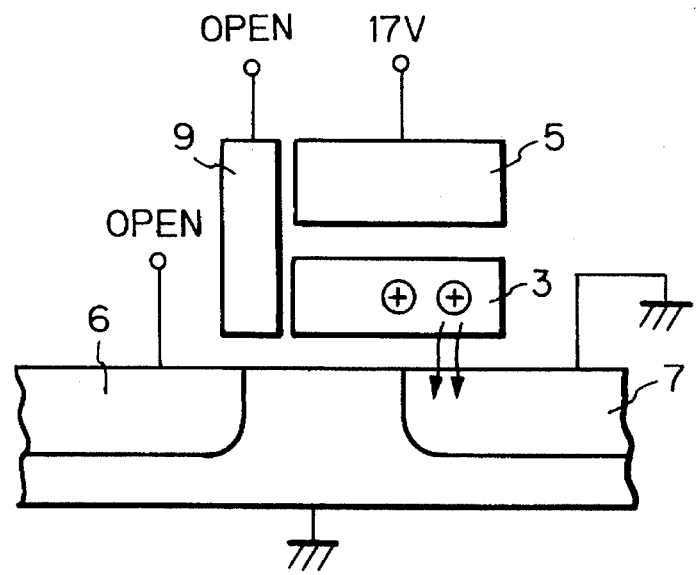

Also, as shown in FIG. 14A, in a similar way as in FIG. 13A, the source region 6 and the auxiliary gate 9 are in a floating state, the control gate 5 is caused to be at 17 V, and the drain region 7 is grounded. Or, the source region 6 and the auxiliary gate 9 are in a floating state, the control gate 5 is caused to be at 15 V, and the drain region 7 is caused to be at −3 V. As a result, the holes accumulated in the floating gate 3 are expelled therefrom to the drain region 7 by Fowler-Nordheim tunneling.

Figure 14B:
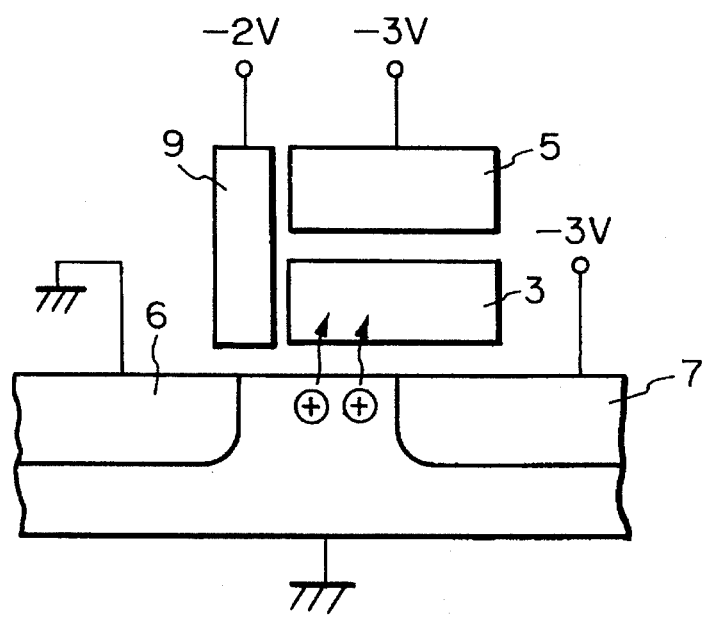

After the above-described operation as shown in FIG. 14A is completed, the control proceeds to a threshold voltage converging mode as shown in FIG. 14B. That is, the source region 6 is grounded, the auxiliary gate 9 is caused to be at −2 V, and the control gate 5 and the drain region 7 are caused to be at −3 V. As a result, a channel current flows from the source region 6 to the drain region 7, i.e., holes flow from the drain region 7 to the source region 6.

As explained hereinbefore, according to the present invention, since a threshold voltage converging operation is carried out by using hot carriers of an enhanced channel current, a voltage applied between the source region and the drain region during a threshold voltage converging mode can be reduced.

I claim:

1. A nonvolatile semiconductor memory device comprising:

a semiconductor substrate of a first conductivity type;

a first gate insulating layer formed on said semiconductor substrate;

a floating gate formed on said first gate insulating layer;

a second gate insulating layer formed on said floating gate;

a control gate formed on said second gate insulating layer;

a source region of a second conductivity type opposite to said first conductivity type, formed within said semiconductor substrate adjacent to said floating gate;

a drain region of said second conductivity type, formed within said semiconductor substrate adjacent to said floating gate and opposite to said source region;

electron expelling means for expelling electrons from said floating gate to one of said source and drain regions by Fowler-Nordheim tunneling;

electron injecting means for injecting hot electrons of a channel current flowing between said source region and said drain region into said floating gate, after an operation of said electron expelling means is completed;

enhancing means for enhancing said channel current; and wherein said semiconductor substrate is of a P-type, and said electron injecting means applies a ground potential, a first positive voltage and a second positive voltage to said source region, said control gate and said drain region, respectively.

2. A device as set forth in claim 1, wherein said first positive voltage is the same as said second positive voltage.

3. A nonvolatile semiconductor memory device comprising:

a semiconductor substrate of a first conductivity type;

a first gate insulating layer formed on said semiconductor substrate;

a floating gate formed on said first gate insulating layer;

a second gate insulating layer formed on said floating gate;

a control gate formed on said second gate insulating layer;

a source region of a second conductivity type opposite to said first conductivity type, formed within said semiconductor substrate adjacent to said floating gate;

a drain region of said second conductivity type, formed within said semiconductor substrate adjacent to said floating gate and opposite to said source region;

electron expelling means for expelling electrons from said floating gate to one of said source and drain regions by Fowler-Nordheim tunneling;

electron injecting means for injecting hot electrons of a channel current flowing between said source region and said drain region into said floating gate, after an operation of said electron expelling means is completed;

enhancing means for enhancing said channel current;

wherein said enhancing means comprises an auxiliary gate, interposed between said source region and said floating gate, and formed over said semiconductor substrate; and wherein said semiconductor substrate is of a P-type, and said electron injecting means applies a ground potential, a first positive voltage, a second positive voltage and a third positive voltage to said source region, said control gate, said drain region and said auxiliary gate, respectively.

4. A device as set forth in claim 3, wherein said first positive voltage is the same as said second positive voltage and is larger than said third positive voltage.

5. A nonvolatile semiconductor memory device comprising:

a semiconductor substrate of a first conductivity type;

a first gate insulating Layer formed on said semiconductor substrate;

a floating gate formed on said first gate insulating layer;

a second gate insulating layer formed on said floating gate;

a control gate formed on said second gate insulating layer;

a source region of a second conductivity type opposite to said first conductivity type, formed within said semiconductor substrate adjacent to said floating gate;

a drain region of said second conductivity type, formed within said semiconductor substrate adjacent to said floating gate and opposite to said source region;

hole expelling means for expelling holes from said floating gate to one of said source and drain regions by Fowler-Nordheim tunneling;

hole injecting means for injecting hot holes of a channel current flowing between said source region and said drain region into said floating gate, after an operation of said hole expelling means is completed;

enhancing means for enhancing said channel current; and wherein said semiconductor substrate is of an N-type, and said hot injecting means applies a ground potential, a first negative voltage and a second negative voltage to said source region, said control gate and said drain region, respectively.

6. A device as set forth in claim 5, wherein said first negative voltage is the same as said second negative voltage.

7. A nonvolatile semiconductor memory device comprising:

a semiconductor substrate of a first conductivity type;

a first gate insulating layer formed on said semiconductor substrate;

a floating gate formed on said first gate insulating layer;

a second gate insulating layer formed on said floating gate;

a control gate formed on said second gate insulating layer;

a source region of a second conductivity type opposite to said first conductivity type, formed within said semiconductor substrate adjacent to said floating gate;

a drain region of said second conductivity type, formed within said semiconductor substrate adjacent to said floating gate and opposite to said source region;

hole expelling means for expelling holes from said floating gate to one of said source and drain regions by Fowler-Nordheim tunneling;

hole injecting means for injecting hot holes of a channel current flowing between said source region and said drain region into said floating gate, after an operation of said hole expelling means is completed;

enhancing means for enhancing said channel current;

wherein said enhancing means comprises an auxiliary gate, interposed between said source region and said floating gate and formed over semiconductor substrate; and wherein said semiconductor substrate is of an N-type, and said hole injecting means applies a ground potential, a first negative voltage, a second negative voltage and a third negative voltage to said source region, said control gate, said drain region and said auxiliary gate, respectively.

8. A device as set forth in claim 7, wherein said first negative voltage is the same as said second negative voltage and is larger than said third negative voltage.

* * * * *